United States Patent [19]
Saito et al.

[11] Patent Number: 5,336,992
[45] Date of Patent: Aug. 9, 1994

[54] ON-WAFER INTEGRATED CIRCUIT ELECTRICAL TESTING

[75] Inventors: Yoshio Saito, Westchester; James C. Lau, Torrance; Steven S. Chan, Alhambra; Richard P. Malmgren, Rancho Dominguez, all of Calif.

[73] Assignee: TRW Inc., Redondo Beach, Calif.

[21] Appl. No.: 892,908

[22] Filed: Jun. 3, 1992

[51] Int. Cl.$^5$ .................. G01R 1/06; G01R 31/02
[52] U.S. Cl. ............................. 324/754; 324/158.1
[58] Field of Search .............. 324/158 P, 158 F, 725, 324/158 R; 439/482

[56] References Cited
U.S. PATENT DOCUMENTS

| | | | |
|---|---|---|---|
| 3,963,985 | 6/1976 | Geldermans | 324/158 F |
| 4,471,298 | 9/1984 | Frohlich | 324/158 P |
| 4,574,235 | 3/1986 | Kelly et al. | 324/158 F |
| 4,636,722 | 1/1987 | Ardezzone | 324/158 P |
| 4,707,657 | 11/1987 | Bolgh-Petersen | 324/158 F |
| 4,746,855 | 5/1988 | Wrinn | 324/158 F |
| 4,906,920 | 3/1990 | Huff et al. | 324/158 F |
| 4,912,399 | 3/1990 | Greub et al. | 324/158 F |
| 4,922,192 | 5/1990 | Gross et al. | 324/72.5 |
| 4,968,931 | 11/1990 | Littlebury et al. | 324/158 F |
| 4,994,735 | 2/1991 | Leedy | 324/158 F |
| 5,012,187 | 4/1991 | Littlebury | 324/158 F |
| 5,055,780 | 10/1991 | Takagi et al. | 324/158 P |
| 5,177,438 | 1/1993 | Littlebury et al. | 324/72.5 |
| 5,177,439 | 1/1993 | Liu et al. | 324/72.5 |
| 5,219,765 | 6/1993 | Yoshida et al. | 324/158 P |

Primary Examiner—Vinh Nguyen

[57] ABSTRACT

An electrical testing device is provided for testing integrated circuits located on a wafer. The testing device employs a multi-layer test circuit having a plurality of contacts for contacting the integrated circuits on a wafer. The layers of the test circuit are embedded in a flexible, supportive dielectric material which allows vertical flexing of the contacts. Cross bar switches are further employed to switch among the plurality of contacts thereby enabling the testing of individual dies of the water to be tested. A microprocessor is further included for controlling the switching and the testing of each die. In an alternate embodiment, the plurality of contacts are mechanically moved relative to the wafer to allow testing of the dies without the need for the switches.

18 Claims, 3 Drawing Sheets

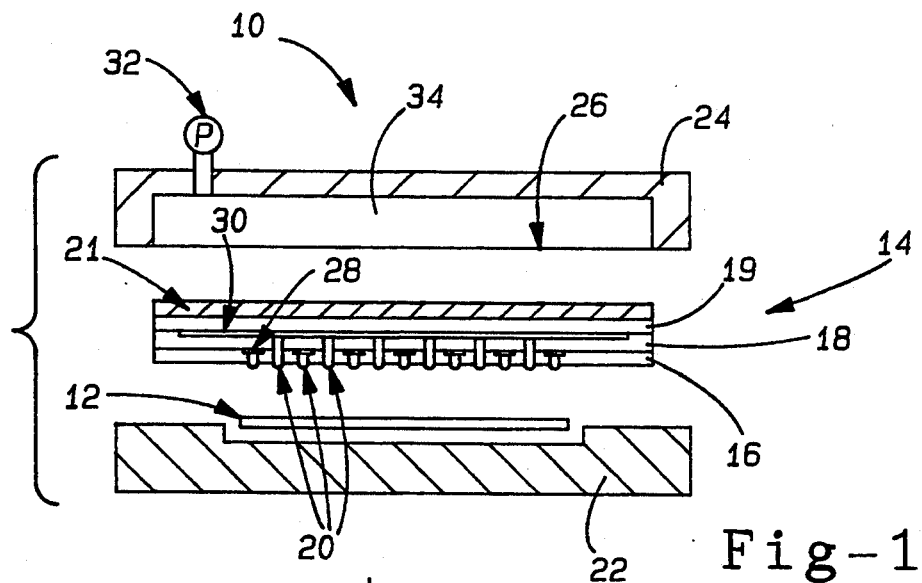
Fig-1
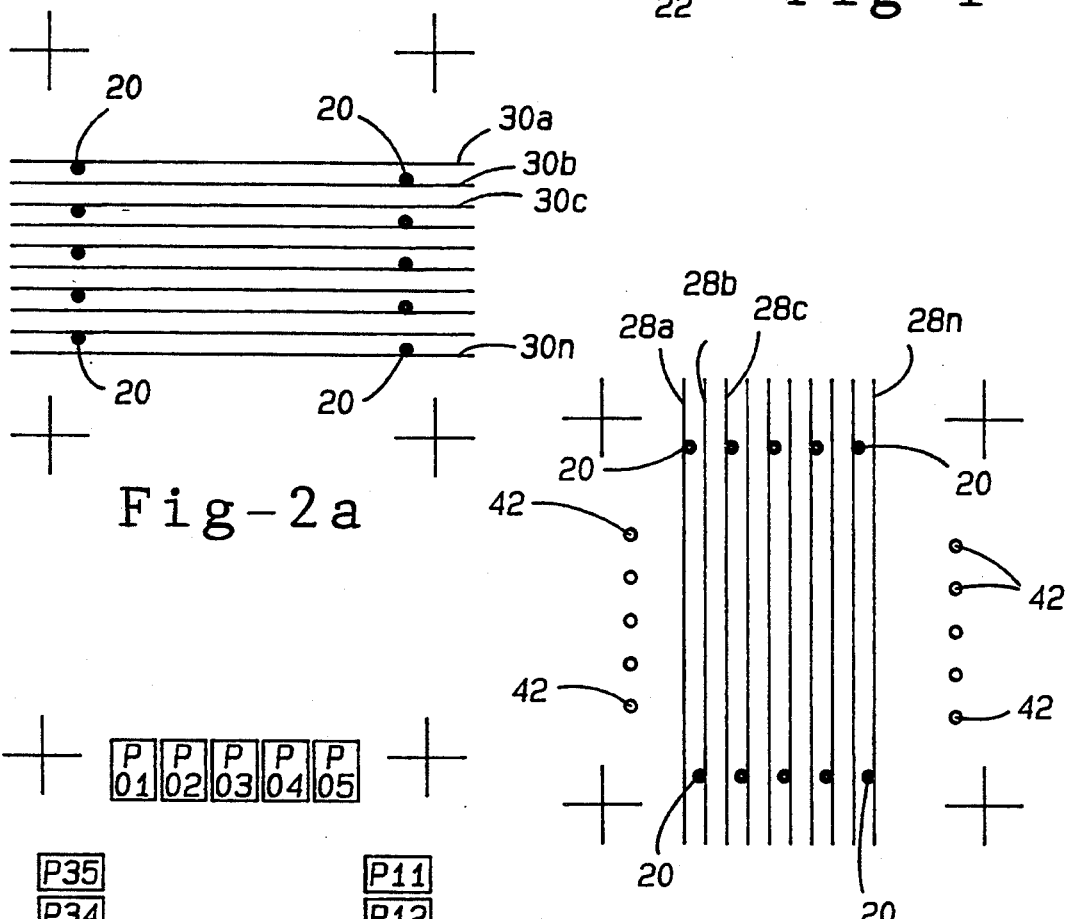
Fig-2a
Fig-2b
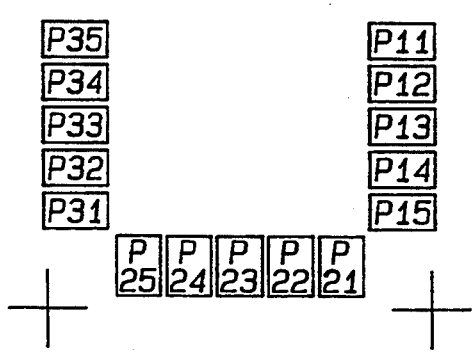
Fig-2c

ON-WAFER INTEGRATED CIRCUIT ELECTRICAL TESTING

BACKGROUND OF THE INVENTION

1. Technical Field

This invention relates to wafers having integrated circuits and, more particularly, to an electrical testing device for testing the integrated circuits located on a wafer before dicing.

2. Discussion

Current silicon wafers generally contain hundreds of integrated circuits fabricated on a single slice of silicon crystal known as a wafer. Each integrated circuit, chip, or die generally contains from tens to hundreds of thousands and possibly millions of electrical components such as inverters and gates which are interconnected to form electrical circuits. Due to increased density and wafer sizes from advanced technology, wafers are continually being developed which provide for more integrated circuits.

Generally, the individual integrated circuits on a wafer are electrically tested to determine whether the circuits or dies function properly and are therefore good. Electrical testing techniques have been provided for testing integrated circuits that have already been diced and therefore separated from the wafer. However, on-wafer electrical testing for integrated circuits before dicing can greatly improve productivity and yield. This is because handling can be reduced due to greatly reduced part count and defective parts can be identified earlier.

Known testing procedures for testing wafers prior to dicing include employing an array of test probes for mechanically stepped on-wafer electrical testing, such as provided by an automatic probing station. This technique essentially tests one die or integrated circuit at a time then moves to another die on the wafer and so on. However, this mechanical stepping technique involves undesirable mechanical movement.

To eliminate the undesirable mechanical movement, a device could be provided which has a sufficient amount of testing probes to test the entire wafer. However, due to the large number of necessary test fixture connections, it is practically impossible to deploy such a one-to-one testing scheme. The large number of connections required would result in a highly complex testing system.

In addition, current testing schemes generally do not provide for testing circuits having contact points close enough to fully meet the requirements of current or future high density wafers. Current methods include a technique employing a "bed of nails" approach. The bed of nails approach generally includes a plurality of wires for contacting the wafer; however, the wires have a limited operation distance.

It is therefore desirable to provide an on-wafer electrical testing device which eliminates or reduces mechanical stepping for testing a plurality of dies on a wafer. It is further desirable to provide a dimensionally stable and compliant testing circuit. In addition, it is desirable to provide a uniform contact between the testing device and the wafer to be tested.

SUMMARY OF THE INVENTION

In accordance with the teachings of the present invention, an on-wafer integrated circuit electrical testing device is provided. The device employs a multilayer test circuit having a plurality of contacts for contacting a wafer to be tested. The circuit is embedded in a flexible dielectric material and supported by a dimensionally stable material. Cross bar switches are employed to switch among the plurality of dies of a wafer to be tested. A microprocessor is further included for controlling the switching and the testing of each die. In an alternate embodiment, the plurality of contacts are mechanically moved relative to the wafer to test the plurality of dies without the requirement of the switches.

BRIEF DESCRIPTION OF THE DRAWINGS

The various advantages of the present invention will become apparent to those skilled in the art by reading the following specification and by reference to the following drawings in which:

FIG. 1 is a diagrammatic cross-sectional view of an on-wafer integrated circuit electrical testing device in accordance with the present invention;

FIG. 2(a) is a top view of the upper contact layer of the testing circuit in accordance with the present invention.

FIG. 2(b) is a top view of the lower contact layer of the testing circuit in accordance with the present invention;

FIG. 2(c) is a top view of contact locations on a wafer to be tested;

DETAILED DESCRIPTION OF THE PREFERRED EMBODIMENT

Figure 3:
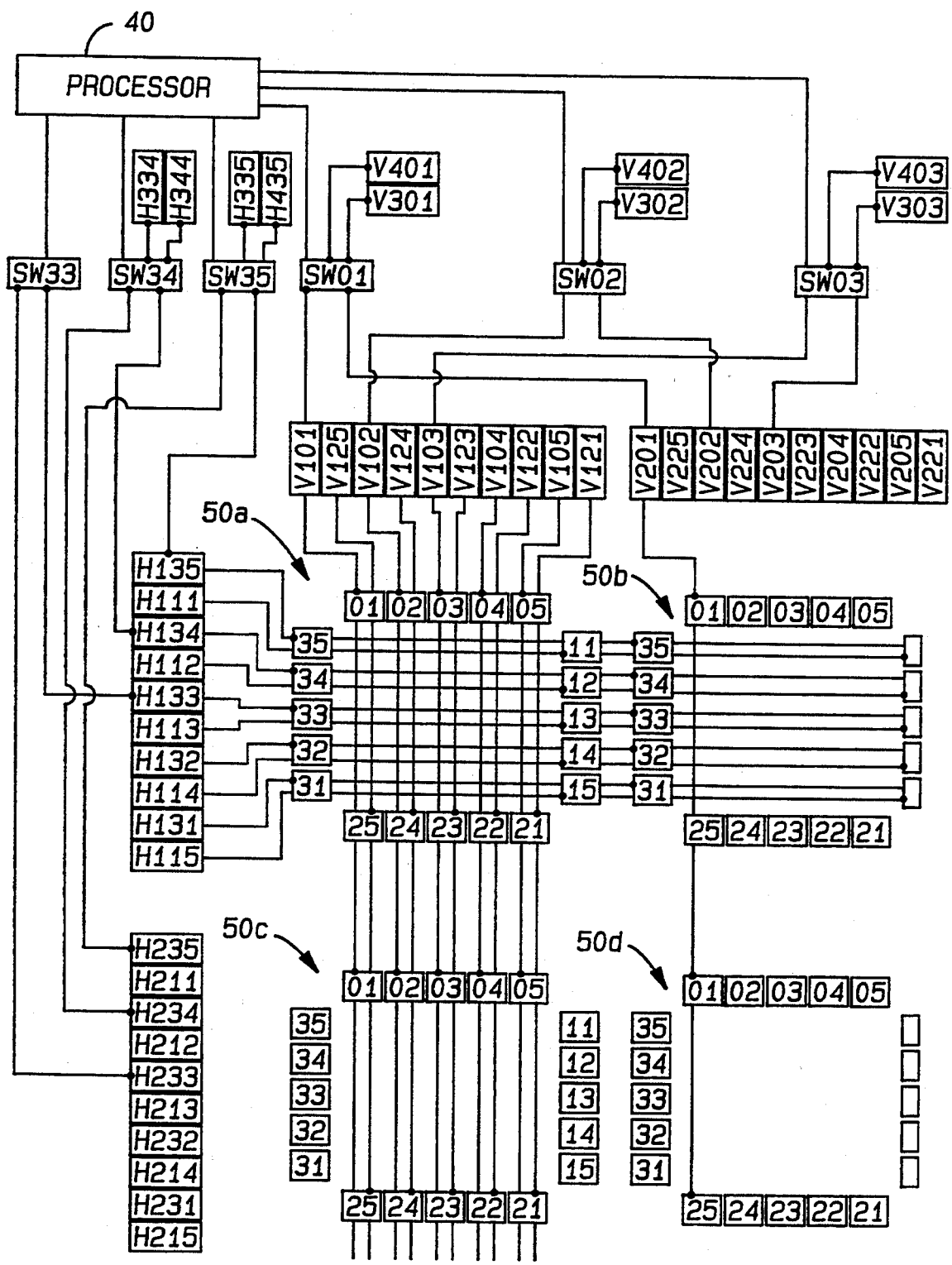
FIG. 3 is a detailed drawing of the contact testing points on the circuit for an on-wafer integrated circuit electrical testing device in accordance with the present invention.

Turning now to FIG. 1, an on-wafer integrated circuit electrical testing device 10 is shown therein for testing the integrated circuits of a wafer 12. Testing device 10 includes a multilayer thin film test circuit 14 having a plurality of testing contact bumps 20 for contacting the integrated circuits located on the wafer 12.

The test circuit 14 includes three layers 16, 18 and 19 being located one on top of the other. A top view of the bottom two layers 18 and 16 is shown in FIGS. 2(a) and 2(b), respectively. The bottom layer 16 of the test circuit 14 includes a plurality of conductive bars 28 positioned in a substantially parallel arrangement. The plurality of conductive bars 28 are embedded in a dielectric support material which provides isolation between the conductive bars 28 and adjacent layers. Each of the plurality of conductive bars 28 includes a plurality of contacts 20 extending vertically downwards from each conductive bar 28.

A second layer 18 is located on top of the bottom layer 16 and has a similar circuit configuration. The second layer 18 of the test circuit 14 includes a second plurality of conductive bars 30 similarly located in a substantially parallel arrangement which are also embedded in a dielectric support material. Each of the second plurality of conductive bars 30 likewise includes a plurality of contacts 20 extending vertically downwards therefrom. Each of the contacts 20 include a conductive via 23 having a contact bump located on the end thereof for contacting the wafer 12 to be tested.

The third or top layer 19 of the test circuit 14 includes a layer of dielectric support material which provides isolation thereof. This invention utilizes a circuit 14 that is configured within the dielectric support material. The preferred embodiment shown includes three layers; however, more or less layers could be employed without departing from the inventive concept described herein.

The dielectric material provided in the three layers of the test circuit 14 is flexible, yet somewhat supportive. As such, the dielectric material allows the conductive bars 28 and 30 and the contacts 20 located thereon to flex vertically, thereby allowing for a snug contact between each of contacts 20 and the wafer 12 to be tested. This flexible dielectric material may include polyimide or Benzocyclobutene (BCB) or any other suitable material that is compatible therewith.

The test circuit 14 is fabricated with precise layer to layer alignment. Test circuit 14 may be fabricated by photolithographic techniques known in the art which are capable of providing a spacing as close as one mil or less between the contacts 20. The close spacing between the contacts 20 thereby allows for testing of very dense wafer circuitry. The contacts 20 are made up of a conductive material such as copper or any other suitable conductive material. In addition, the finishing metallization for the contacts 20 are preferably optimized for minimum contact resistance and cold welding, and are formed by vacuum deposition and lift-off.

The testing device 10 further employs an air chamber 34 which is located above the test circuit 14. The air chamber 34 receives pressurized air through pressure switch 32 from an external pressurized air source (not shown). The bottom surface of the air chamber 34 includes a thin foil bottom 26 made of high strength metal which is capable of flexing. When the air pressure in the air chamber 34 is increased, the thin foil 26 flexes outwards as the air chamber 34 expands, to contact a support layer 21 located on top of the circuit 14. The support layer 21 is made of a dimensionally stable material having a coefficient of thermal expansion (CTE) substantially matching the CTE of the wafer 12. The support layer 21 essentially provides dimensional support to the test circuit 14. As a result of this expansion, the thin foil bottom 26 of air chamber 34 applies uniform pressure to the test circuit 14, which, in turn, causes the contacts 20 of test circuit 14 to contact the integrated circuits or dies on the wafer 12. A base plate 22 is further provided on the bottom of the testing device 10 for maintaining each wafer 12 to be tested in a static position while undergoing the desired operation. The base plate 22 in conjunction with the support layer 21 provide dimensional stability to the test circuit 14.

FIGS. 2(a) through 2(c) illustrate the alignment of the bottom two layers 16 and 18 of the test circuit 14 with the contact positioning on a die 50 of a wafer 12. FIG. 2(a) shows the upper layer 18 of the test circuit 14 which includes a plurality of conductive bars 30A through 30N. Each of the plurality of conductive bars 30A through 30N includes a plurality of contacts 20 connected therewith. Each of the contacts 20 extend from the corresponding conductive bar downward through an opening in the bottom layer 16 to the contact location on the die 50 of a wafer 12 to be tested. Each of the plurality of conductive bars 30 are isolated from one another with a dielectric material.

FIG. 2(b) illustrates the bottom layer 16 of the test circuit 14. The bottom layer 16, likewise, includes a plurality of conductive bars 28A through 28N. Each of the conductive bars 28A through 28N similarly have a plurality of contacts 20 connected therewith. Each of the contacts 20 extend downward from the corresponding conductive bar 28 and are adapted to contact the die of the wafer 12 to be tested. The bottom layer 16 further includes a plurality of openings (42) through which the contacts 20 from the upper layer 18 are allowed to extend therethrough.

FIG. 2(c) illustrates the contact locations P01-P05, P11-P15, P21-P25, and P31-P35 on a die 50 of a wafer 12 to be tested. Each of the contact locations represents the positions on the die 50 in which each of the contacts 20 from the upper and lower layers 16 and 18 of the test circuit 14 are adapted to contact to test the die 50 on the wafer 12.

FIG. 3 illustrates the contact testing points on the circuit and the switching associated with the testing of the plurality of dies 50a through 50d on a wafer 12. The testing device 10 is preferably set up to test one of the dies 50a through 50d, one at a time. In the preferred embodiment, the testing device 10 employs a plurality of switches which allows the device 10 to select which die is to be tested. The switches SW01, SW02, and SW03 control the vertical column switching. Similarly, the switches SW35, SW34 and SW33 control the horizontal row switching.

A microprocessor 40 is further provided. The microprocessor 40 is a standard off the shelf programmable microprocessor having programming capabilities. Microprocessor 40 controls the switching sequence and further receives and analyzes the test signals to determine whether each die operates properly. Switch SW01 shown on the vertical column is adapted to select one of the vertical test signals V101, V201, ... VN01. Switch SW02, likewise, is adapted to select one of the test signals V102, V202, ..., VN02. Likewise, the horizontal rows are configured to operate in the same manner. Switch SW35 is adapted to select one of the horizontal test signals H135, H235, ..., HN35 and so on. In this manner, the device 10 is able to select the appropriate die 50 to test without requiring additional mechanical movement.

The switching described herein is provided so that the need to move the test probes from die to die can be eliminated. The use of the switching alone, however, is provided at a cost of being unable to test some combination of contact points. In order to assure that all contact point combinations are testable, the device 10 may employ relative movement of the test circuit 14 and the wafer 12 in accordance with an alternate embodiment of the present invention. The advantage of being able to test points on a wafer separated by one mil is retained. The relative movement of the test circuit 14 on the wafer 12 under testing conditions can be limited to movement from row to row only. This could be accomplished in a pattern simpler than the mechanical probe where both movement from row to row and from column to column are generally required.

Figure 4:
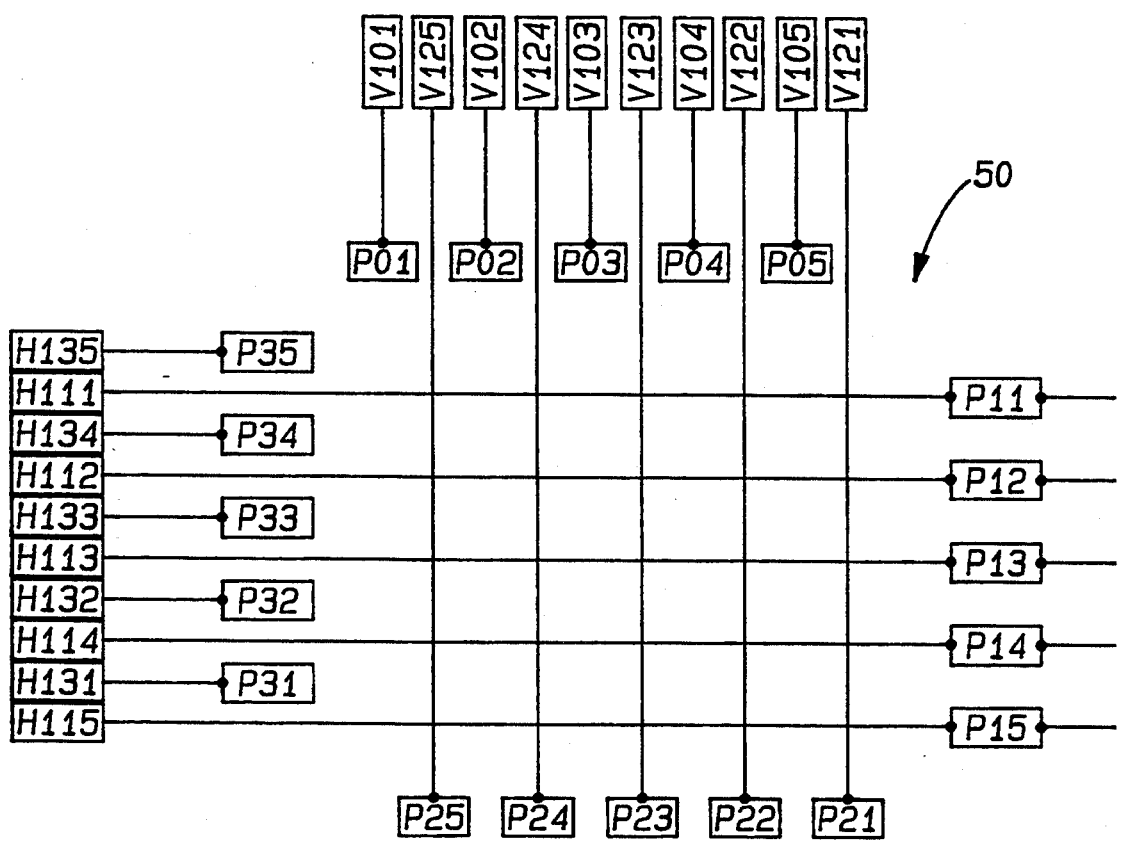
FIG. 4 is a partial view of FIG. 3 which illustrates the contacts for a single die on a wafer.

Turning now to FIG. 4, shown therein is the testing configuration for one individual die 50 of the wafer 12. The testing scheme for this single die 50 is a ten-by-ten array which includes ten vertical input signals V101 through V105 and V121 through V125 and ten horizontal output signals H111 through H115 and H131 through H135. The Testing signals are applied to the twenty test points shown therein which include vertical test points P01 through P05 and P21 through P25 and horizontal test points P11 through P15 and P31 through P35.

In operation, vertical test signal V101 is applied to contact point P01. The microprocessor 40 then receives an output signal from the desired horizontal contact point as chosen. The microprocessor 40 then determines whether or not the measured output signals indicates proper operation of the die 50. Similarly, vertical test signal V102 is applied to contact point P02. The microprocessor 40 receives an output signal from the desired horizontal contact point as chosen. The remaining signals are applied to the remaining contact points and the die 50 is tested in a likewise manner.

In view of the foregoing, it can be appreciated that the present invention enables the user to achieve a more simplified and effective testing device for testing the integrated circuits on a wafer. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. An electrical testing device for testing integrated circuits on a wafer, said device comprising:
    circuit means including a multilayer thin film test circuit fabricated in a flexible dielectric material, said test circuit having a plurality of conductive contacts extending therefrom for contacting contact points on circuitry on the wafer to be tested;
    a dimensionally stable support material having a coefficient of thermal expansion substantially matching a coefficient of thermal expansion of said wafer located on top of said circuit means and directly above said contacts;
    actuation means for forcibly contacting said support material so as to cause said conductive contacts to contact the contact points of the integrated circuit on said wafer; and
    said circuit means having a plurality of conductive traces embedded within said flexible dielectric material, each of said traces being isolated therebetween and having said contacts connected thereto.

2. The device as defined in claim 1 wherein said test circuit comprises:
    a first circuit layer having a first plurality of conductive traces embedded within a first layer of said flexible dielectric material and isolated therebetween, each of said first plurality of conductive traces having a first plurality of contacts extending outward therefrom; and
    a second circuit layer located on top of said first circuit layer and having a second plurality of conductive traces embedded within a second layer of said flexible dielectric material, each of said second plurality of conductive traces having a second plurality of contacts extending outward therefrom.

3. The device as defined in claim 2 wherein said test circuit further comprises:
    a third layer of dielectric material being located on top of said second circuit layer for providing isolation thereon.

4. The device as defined in claim 3 wherein said dielectric material of said test circuit includes a flexible material that allows the conductive traces and said contacts thereon to flex vertically, thereby providing adequate contact between each contact and said wafer to be tested.

5. The device as defined in claim 4 wherein said flexible dielectric material comprises polyimide.

6. The device as defined in claim 4 wherein said flexible dielectric material comprises benzocyclobutene.

7. The device as defined in claim 1 comprising:
    processor means including a programmable microprocessor for processing the testing of said integrated circuits.

8. The device as defined in claim 7 wherein said circuit means further comprises:
    a plurality of said test circuits, each of said test circuits being adapted to test a die on said wafer.

9. The device as defined in claim 8 further comprises:
    a plurality of cross bar switches connected to said plurality of test circuits, said switches being activated to select one of said plurality of said test circuits one at a time.

10. The device as defined in claim 1 wherein said actuation means includes:
    an air chamber for receiving pressurized air, said air chamber being located above said test circuit and having a thin flexible foil bottom portion which expands when receiving increased air pressure and provides uniform pressure to said test circuit to cause said contacts to contact the wafer to be tested.

11. The device as defined in claim 10 wherein said actuation means further includes an adjustable pressure control for controlling the pressure of the air in said air chamber.

12. The device as defined in claim 11 further comprising top and bottom fixtures for enclosing said device, said bottom fixture being adapted to maintain the wafer to be tested in a steady position during testing.

13. An electrical testing device for testing the integrated circuits on a wafer, said device comprising:
    circuit means including a thin multilayer test circuit formed in a flexible dielectric material;
    said circuit means having a first plurality of conductive traces embedded in a first layer of said flexible dielectric material and isolated therebetween and having a first plurality of electrical contacts extending outward therefrom,
    said circuit means having a second plurality of conductive traces embedded in a second layer of said flexible dielectric material and isolated therebetween and having a second plurality of electrical contacts extending outward therefrom;
    a support material having a coefficient of thermal expansion substantially matching a coefficient of thermal expansion of said wafer located on top of said circuit means and directly above said contacts for providing dimensional stability to said circuit; and
    actuation means located on top of said support material for forcibly contacting said support material so as to cause said first and second plurality of electrical contacts to contact points of the integrated circuit on a wafer to be tested.

14. The device as defined in claim 13 comprising:
    processor means including a programmable microprocessor for processing the testing of said integrated circuits.

15. The device as defined in claim 14 wherein said circuit means further comprises:

a plurality of said test circuits, each of said test circuits being adapted to test a die on said wafer.

16. The device as defined in claim 15 further comprises:

a plurality of cross bar switches connected to said plurality of test circuits, said switches being activated to select one of said plurality of said test circuits.

17. A method for testing electrical integrated circuits on a wafer, said method comprising:

providing a multi-layer test circuit having conductive traces embedded within a flexible dielectric material and a plurality of thin contacts extending therefrom;

applying a substantially uniform pressure to a dimensionally stable support material having a coefficient of thermal expansion substantially matching a coefficient of thermal expansion of said wafer, wherein said dimensionally stable support material is located on top of said circuit to cause said contacts to contact the electrical contacts of the integrated circuits on the wafer to be tested;

testing one die of said wafer; and switching to another die after the testing on the previous die is completed.

18. The method as defined in claim 17 wherein the step of switching comprises selectively electrically switching said test circuit so as to switch from one die to another die.

* * * * *